(12) United States Patent
Kondo

(10) Patent No.: US 6,271,053 B1
(45) Date of Patent: Aug. 7, 2001

(54) METHOD OF MANUFACTURING A THIN FILM SOLAR BATTERY MODULE

(75) Inventor: Masataka Kondo, Kobe (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/433,905

(22) Filed: Nov. 4, 1999

(30) Foreign Application Priority Data

Mar. 25, 1999 (JP) .................................. 11-081961

(51) Int. Cl.⁷ .................................................. H01L 21/00
(52) U.S. Cl. ................... 438/57; 438/57; 438/96; 438/98; 438/608; 438/652; 136/244; 136/258; 136/290
(58) Field of Search ..................... 136/244, 258, 136/290; 438/96, 98, 608, 642, 652, 57

(56) References Cited

U.S. PATENT DOCUMENTS

| 4,166,918 | 9/1979 | Nostrand et al. ............ 136/243 |
| 4,838,950 | 6/1989 | Ramaprasad ............. 136/244 |
| 4,862,227 | 8/1989 | Tsuge et al. ............. 136/244 |

FOREIGN PATENT DOCUMENTS

| 0 134 364 | 3/1985 | (EP) . |
| 60-208869 | 10/1985 | (JP) . |
| 61-156775 | 7/1986 | (JP) . |

OTHER PUBLICATIONS

Kondo M et al.: "Low-cost amorphous silicon photovoltaic module encapsulated with liquid resin", Solar Energy Materials and Solar Cells 49 (1997) pp. 127–133.

Primary Examiner—Charles Bowers
Assistant Examiner—Asok Kumar Sarkar
(74) Attorney, Agent, or Firm—Hogan & Hartson L.L.P.

(57) ABSTRACT

A method of manufacturing an integrated thin film solar battery module including a substrate, and a plurality of unit cells connected in series on the substrate, each of the unit cells having a first electrode layer, a semiconductor layer and a second electrode layer which are stacked one upon the other on the substrate. The method includes the steps of scribing the first electrode layer formed on the substrate, forming a semiconductor layer on the first electrode layer, scribing the semiconductor layer for each of the plurality of unit cells to form openings for connection to the first electrode layer, forming a second electrode layer on the semiconductor layer, scribing the second electrode layer and the semiconductor layer in the vicinity of the openings formed in the semiconductor layer, allowing an edge surface of the semiconductor layer to be exposed to the outside by removing residues of the second electrode layer and the semiconductor layer, and applying a heat treatment at 130° C. or higher after division of the second electrode layer and the semiconductor layer.

14 Claims, 1 Drawing Sheet

METHOD OF MANUFACTURING A THIN FILM SOLAR BATTERY MODULE

BACKGROUND OF THE INVENTION

The present invention relates to a method of manufacturing an integrated thin film solar battery module having a plurality of unit cells formed on a substrate, in which defects generated in the step of partially removing a second electrode for dividing the second electrode corresponding to unit cells are eliminated and the contact interface between a semiconductor layer and the second electrode is improved so as to contribute to the development of an integrated thin film solar battery having a high conversion efficiency.

In recent years, a solar battery in which energy of the solar light is converted directly into electric energy has begun to be used widely. As a matter of fact, a crystalline solar battery using a single crystalline silicon or a polycrystalline silicon has already been put to a practical use as an outdoor solar battery for generating an electric power. On the other hand, a thin film solar battery using an amorphous silicon, etc., which permits decreasing the raw materials and, thus, attracts attentions as a low cost solar battery, is presently on the stage of development as a whole. Vigorous studies are being made nowadays on the thin film solar battery in an attempt to permit the solar battery to be used outdoors on the basis of the actual results achieved in the use as a power source for civil electric appliances such as hand-held calculators that have already been put widely to a practical use.

Deposition of a thin film by means of CVD, sputtering, etc., and patterning of the deposited thin film are repeatedly carried out for forming a desired structure of a thin film solar battery, as in the manufacture of the conventional thin film device. In general, employed is an integrated structure in which a plurality of unit cells are connected in series on a single substrate. When it comes to a solar battery arranged outdoors for power generation, the solar battery includes a substrate having a very large area exceeding, for example, 400×800 (mm).

FIG. 1 is a cross sectional view showing the construction of a thin film solar battery. FIG. 2 is a plan view schematically showing the thin film solar battery shown in FIG. 1. As shown in the drawings, a first electrode layer 2, a semiconductor layer 4 consisting of, for example, an amorphous silicon, and a second electrode layer 6 are laminated one upon the other in the order mentioned on a glass substrate 1. These layers are divided corresponding to a plurality of unit cells 11. The second electrode layer 6 and the first electrode layer 2 are connected to each other via openings for connection, i.e., scribe lines 5 formed in the semiconductor layer 4, and the adjacent unit cells 11 are connected in series.

The first electrode layer 2 consists of a transparent conductive oxide such as tin oxide ($SnO_2$), zinc oxide (ZnO), or indium tin oxide (ITO). On the other hand, the second electrode layer 6 consists of a metal film formed of aluminum (Al), silver (Ag), or chromium (Cr).

The integrated thin film solar battery of the particular construction is prepared as follows. In the first step, a transparent conductive oxide such as $SnO_2$, ZnO or ITO is deposited on the glass substrate 1 to form the first electrode layer 2. The first electrode layer 2 thus formed is laser-scribed at the positions of the scribe lines 3 to divide the first electrode layer 2 corresponding to the plural unit cells (power generating regions). The substrate is washed for removing the molten residue generated by laser-scribing. Then, a semiconductor layer 4 made of amorphous silicon and having a pin junction structure is deposited by a plasma CVD method. The semiconductor layer 4 thus formed is partly laser-scribed at positions of the scribe lines 5 about 100 μm away from the scribe lines 3 of the first electrode layer 2. The scribe line 5 provides an opening for connection of the second electrode layer and the first electrode layer. Then, a metal film consisting of, for example, Al, Ag or Cr is formed as the second electrode layer 6 in the form of a single layer or a plurality of layers on the semiconductor layer 4. The second electrode layer 6 thus formed is partly laser-scribed at positions of scribe lines 7 about 100 μm away from the scribe lines 5 of the semiconductor layer 4. In this step, the second electrode layer 6 and the semiconductor layer 4 positioned below the layer 6 are successively removed at the positions of the scribe lines 7. Thus, an integrated thin film solar battery having a plurality of unit cells connected in series is fabricated.

In the next step, a filler made of a thermosetting resin such as ethylene-vinyl acetate copolymer (EVA) and a protective film consisting of, for example, fluorocarbon resin, e.g., Tedler manufactured by Du Pont, is laminated on the back surface of the thin film solar battery, followed by encapsulating by means of, for example, a vacuum laminator. Then, a frame is mounted to surround the thin film solar battery, thereby completing a thin film solar battery module.

The conventional integrated thin film solar battery was defective in its output characteristics. Particularly, the fill-factor (FF value) of the conventional solar battery was low. In the manufacture of an integrated thin film solar battery, it is attempted to make optimum the process conditions such as the thickness of the first and second electrode layers 2 and 6 and film quality of the semiconductor layer 4 in order to improve the characteristics of the solar battery. When it comes to a substrate having a large area, however, the experiment for making the process conditions optimum is rendered complex. Therefore, an auxiliary experiment is conducted first for preparing a thin film solar battery having a small area by a simplified process so as to evaluate the characteristics of the solar battery and to determine the optimum process conditions. The optimum conditions thus obtained are applied to the manufacturing process of a thin film solar battery having a large area.

However, where the process conditions optimum for the manufacture of a thin film solar battery having a small area are applied as they are to the manufacture of a thin film solar battery having a large area, it is difficult to obtain satisfactory results as obtained in the auxiliary experiment. In many cases, the FF values of the solar battery having a large area are lowered. Under the circumstances, it is absolutely necessary and urgently required to improve the FF value for improving the conversion efficiency in an integrated thin film solar battery having a large area.

As a result of an extensive research, the present inventor has found that the decrease in the FF value of a thin film solar battery is considered to be caused by two factors. First of all, attentions should be paid to a poor interface between the semiconductor layer 4 and the second electrode 6. This problem can be solved by forming a conductive layer on the semiconductor layer so as to prevent a native oxide film from being formed in the washing step after the scribing of the semiconductor layer, as disclosed in Japanese Patent Disclosure (Kokai) No. 9-8337. A second problem is that a short-circuit or electric conduction takes place in that portion of the semiconductor layer which is removed subsequent to the removal of a part of the second electrode layer. To be more specific, a fresh surface of the semiconductor layer appears between the second electrode layer and the first electrode layer at the position of the scribing line of the second electrode layer. Since the fresh surface of the semiconductor layer is unstable, the electric resistance is lowered, if an impurity is attached to the fresh surface even if the amount of the impurity is very small. As a result, a short-circuit or electric conduction is caused to take place between the second electrode layer and the first electrode layer.

The present inventor has studied to apply known methods in an attempt to solve the second problem described above. It has been found, however, that the known methods are incapable of overcoming the problem.

For example, Japanese Patent Disclosure No. 61-198685 discloses an idea that a semiconductor layer is scribed and divided by means of a laser beam irradiation under an oxidizing atmosphere. The present inventor has studied an idea of oxidizing the exposed surface of a semiconductor layer by applying the laser beam irradiation under an oxidizing atmosphere to the scribing of the second electrode layer. However, it is difficult to retain a substrate having a large area under an oxidizing atmosphere. In addition, heat of high temperature tends to be locally generated during the laser beam irradiation, leading to fire occurrence. In other words, the laser beam irradiation is dangerous.

Similarly, Japanese Patent Disclosure No. 61-156775 teaches that an amorphous solar battery of a stacked structure in which a metal electrode, an amorphous silicon layer and a transparent electrode are formed on a substrate is subjected to a laser processing under a heated steam atmosphere to divide the stacked structure into cells. It is also taught that the divided cells are subjected to a heat treatment at a temperature ranging from 150 to 300° C. In this method, a heated steam is blown in the laser processing step to prevent the amorphous silicon layer from being crystallized. It has been found, however, that, in this method, the substrate linearly expands by heating so as to markedly lower processing accuracy with the laser beam. Also, it is difficult to remove completely a residue in the processed portion even if a steam-containing carrier gas is blown in the laser processing step. It is particularly difficult to remove the residue completely where the laser processing is performed at a high speed. In this case, it is substantially impossible to allow the processed edge surface to be exposed completely to the outside.

Japanese Patent Disclosure No. 61-280679 discloses an idea of forming an insulating layer thicker than the semiconductor layer in that region of the first electrode layer which corresponds to the scribe line of the second electrode layer. In this case, since the insulating layer is formed below the semiconductor layer, a cross section of the semiconductor layer does not appear between the first electrode layer and the second electrode layer when the second electrode layer and the semiconductor layer below the second electrode layer are scribed. However, formation of the insulating layer decreases the area of the cells capable of power generation. In addition, it is difficult to form accurately an insulating layer to conform with cells formed on a large area substrate.

Further, Japanese Patent Disclosure No. 60-85574 discloses an idea of using Cr or Ni for forming the second electrode. The disclosure is based on an erroneous recognition that the second electrode forms an alloy with silicon in the scribing step of the second electrode so as to bring about electric conduction. However, the technical idea disclosed in this prior art is clearly incapable of solving the problem in respect of the decreased FF value.

The other technique to restore fill-factor is disclosed in U.S. Pat. No. 4,371,738, which described Staebler-Wronski effect that the defects in hydrogenated amorphous silicon induced by light irradiation annealed out by heating one. The technique can only restore the defects induced by light irradiation, but the patent does not have a concept of restoring defects induced in silicon layer during the laser scribing of the second electrode.

BRIEF SUMMARY OF THE INVENTION

An object of the present invention is to provide a method of manufacturing a thin film solar battery module having a high efficiency by decreasing an undesired current path at the exposed surface of a semiconductor layer that is removed subsequent to the scribing step of the second electrode layer.

According to an aspect of the present invention, there is provided a method of manufacturing an integrated thin film solar battery module comprising a substrate, and a plurality of unit cells connected in series on the substrate, each of the unit cells comprising a first electrode layer, a semiconductor layer and a second electrode layer which are stacked one upon the other on the substrate, the method comprising the steps of:

partly removing the first electrode layer formed on the substrate to divide the first electrode layer corresponding to the plurality of unit cells;

forming a semiconductor layer on the first electrode layer;

partly removing the semiconductor layer for each of a plurality of unit cells to form openings for connection to the first electrode layer;

forming a second electrode layer on the semiconductor layer;

partly removing the second electrode layer and the semiconductor layer in the vicinity of the openings formed in the semiconductor layer so as to divide the second electrode layer and the semiconductor layer corresponding to the plurality of unit cells;

allowing an edge surface of the semiconductor layer to be exposed to the outside by removing residues of the second electrode layer and the semiconductor layer; and applying a heat treatment at 130° C. or higher, preferably at 150° C. or higher after division of the second electrode layer and the semiconductor layer.

In the present invention, a laser beam irradiation is employed for removing a part of each of the first electrode, the semiconductor layer and the second electrode. The laser beam irradiation is performed around room temperature, i.e., room temperature ±10° C.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
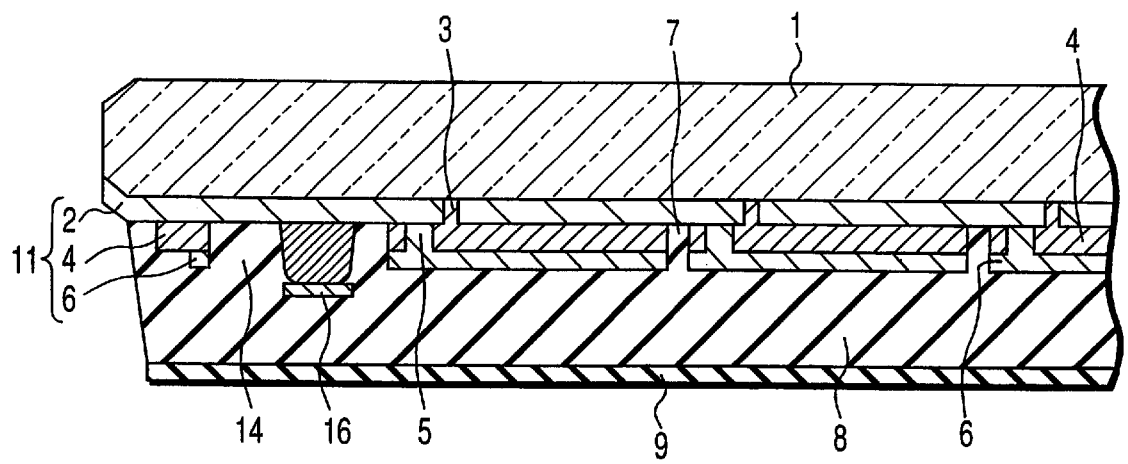
FIG. 1 is a cross sectional view showing a thin film solar battery module according to one embodiment of the present invention.
Figure 2:
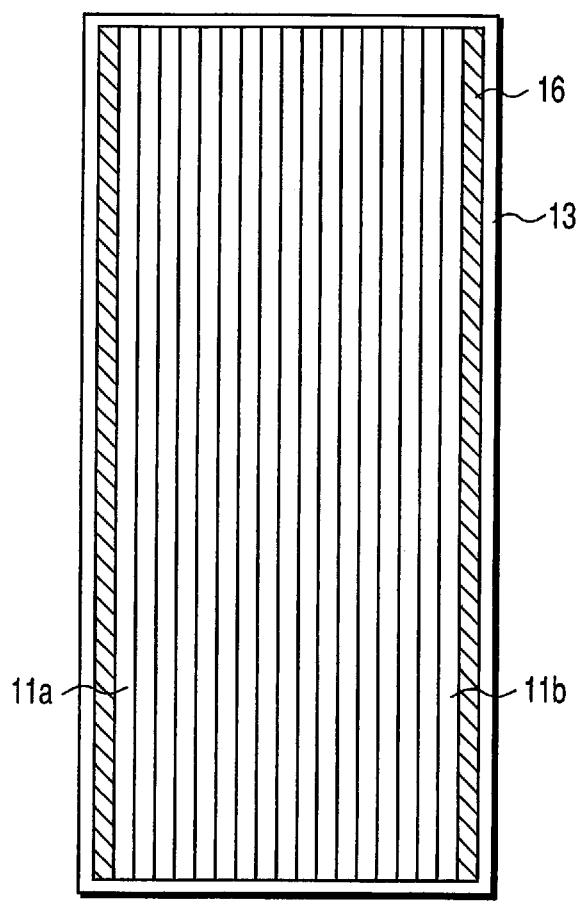
FIG. 2 is a plan view showing the thin film solar battery module shown in FIG. 1.

As described above, the semiconductor layer positioned below the second electrode layer is also removed partly in the scribing step of the second electrode layer. As a result, the second electrode layer, the fresh surface of the semiconductor layer and the first electrode layer are newly exposed to the outside. As described previously, the fresh surface of the semiconductor layer is unstable and, thus, the electric resistance is lowered if an impurity is attached to the fresh surface even if the amount of the impurity is very small. It follows that a short-circuit or electric conduction tends to take place in the particular region.

It is known to the art that a native oxide film is formed on a surface of a semiconductor layer under, for example, the air atmosphere. Formation of the native oxide film, which is an activating process, is rapidly promoted by heating. This phenomenon is utilized in the present invention. Specifically, a heat treatment is applied at 130° C. or higher, preferably at 150° C. or higher, after division of the second electrode layer and the semiconductor layer so as to render the fresh surface of the semiconductor layer nonconductive, thereby preventing the first and second electrode layers from being electrically connected to each other via semiconductor.

In the present invention, the laser scribing is performed around room temperature in order to prevent the processing accuracy from being lowered by thermal expansion of the substrate. Therefore, the fresh surface of the semiconductor layer is not rendered nonconductive in the laser scribing step.

In order to obtain without fail the effect produced by the heat treatment employed in the present invention, it is necessary to expose the edge surface of the semiconductor layer to the outside in the scribing groove of the second electrode layer and the semiconductor layer in the step of the heat treatment. It should be noted that, if the second electrode layer and the semiconductor layer are simply divided by the laser processing, residues of the second electrode layer and the semiconductor layer remain within the scribing groove to cover the edge surface of the semiconductor layer. As a result, the effect of the heat treatment is markedly lowered in the edge portion covered with these residues. Such being the situation, it is necessary to remove the residues of the second electrode layer and the semiconductor layer before the heat treatment. For removing these residues, ultrasonic cleaning within a liquid such as water or blowing of a pressurized water is more effective than the air blowing.

In the present invention, the heat treatment can be performed under the air atmosphere by using, for example, an oven. The heat treatment should be carried out at, for example, 150° C. for at least 20 minutes, or at 160° C. for at least 15 minutes. In the present invention, the heat treatment, which can be carried out at an arbitrary temperature lower than the temperature at which the semiconductor layer is formed, should be carried out at 130° C. or higher, preferably at 140° C. or higher, and most preferably 150° C. or higher. Since it suffices to carry out the heat treatment for a time sufficient for rendering the fresh surface of the semiconductor layer nonconductive, the heat treating time at a predetermined temperature can be determined as follows. Specifically, prepared is a coordinate system assigning a reciprocal of the absolute temperature on the abscissa and a logarithm of reciprocal of time on the ordinate. Depicted in this coordinate system is a straight line (Arrhenius plot) joining a point corresponding to the condition of 150° C. and 20 minutes and another point corresponding to the condition of 160° C. and 15 minutes. Based on the graph, the heat treating time is determined to be longer than a time positioned on the straight line at a predetermined heat treating temperature.

The timing of the heat treatment is not particularly limited as far as the heat treatment is performed after division of the second electrode and the semiconductor layer. Also, the heat treatment can be performed under any environment as far as an oxidizing agent such as an oxygen gas is present in an amount sufficient for oxidizing an edge surface of the semiconductor layer. Of course, the heat treatment can be performed simultaneously with the step of laminating and encapsulating a filler resin sheet and a protective film on the back surface of the solar battery module. In particularly, where EVA is used as a filler resin, a peroxide is used as a polymerization initiator. Therefore, the oxidation is promoted even in a vacuum laminate step. It should be noted, however, that it is necessary to set the heat treating time to permit the filler resin to be cured sufficiently and to enable the effect of the heat treatment to be produced sufficiently. To be more specific, EVA called fast cure type is cured at 150° C. for 2 minutes. However, it is necessary to carry out the heat treatment for at least 20 minutes in the present invention. Furthermore, EVA commercially available may be dissociated while annealing at the temperature described in this invention for longer period of time. Therefore, it is unfavorable to combine the annealing and encapsulation into one process.

Where the step of applying a reverse bias voltage to the unit cell in order to eliminate the defects of the semiconductor layer is incorporated in the process of the present invention for manufacturing a solar battery module, it is desirable to carry out the heat treatment before the reverse bias treatment. It should be noted in this connection that the defects, which are generated in the step of scribing the second electrode layer and the semiconductor, tend to be formed linearly in many cases. The reverse bias treatment is certainly adapted for eliminating dot-like defects. However, it is difficult to remedy the linear defects by the reverse bias treatment. Therefore, it is desirable to carry out the reverse bias treatment after the short-circuit defects, occurring in the removed region of the second electrode layer and the semiconductor layer, have been eliminated by the heat treatment of the present invention.

An Example of the present invention will now be described.

EXAMPLE

A solar battery module as shown in FIG. 1 was manufactured as follows.

In the first step, a tin oxide film 2 having a thickness of 8000 Å was formed by a thermal CVD method on a glass substrate 1 made of a soda lime glass having an area of 92 cm×46 cm, and a thickness of 4 mm. The tin oxide film 2 thus formed was divided into strings by scribing at positions of the scribe lines 3 with a laser scriber at room temperature (25° C.) so as to prepare transparent electrodes corresponding to a plurality of unit cells. To be more specific, the substrate 1 was set on an X-Y table and irradiated with a second harmonic having a wavelength of 532 nm under a frequency of 3 kHz, an average output of 500 mW and a pulse width of 10 ns. The separation width, i.e., the width of the scribe line 3, was set at 50 μm, and the width of the string constituting the unit cell was set at about 10 mm. The substrate was washed for removing the molten residue generated by laser-scribing.

Then, the substrate 1 was put in a multi-chamber type plasma CVD apparatus so as to carry out a plasma CVD at 200° C., thereby forming an a-Si layer 4 on the patterned tin oxide film 2. The a-Si layer 4 consisted of a p-type a-SiC:H layer, an i-type a-Si:H layer, and an n-type microcrystalline Si:H layer so as to form a pin junction. These semiconductor layers were formed under the conditions described below.

Specifically, for forming the p-type a-SiC:H film, $SiH_4$ was supplied at a flow rate of 100 sccm, $B_2H_6$ diluted with a hydrogen gas to 1000 ppm was supplied at a flow rate of 2000 sccm, and $CH_4$ for carbon alloying was supplied at a flow rate of 30 sccm. After the pressure was set at 1 Torr, a power of 200 W was applied so as to generate a plasma and, thus, to form the p-type a-SiC:H film.

For forming the i-type a-Si:H film, $SiH_4$ was supplied at a flow rate of 500 sccm and, after the pressure was set at 0.5 Torr, a power of 500 W was applied so as to generate a plasma and, thus, to form the i-type a-Si:H film.

Further, for forming the n-type microcrystalline a-Si:H film, $SiH_4$ was supplied at a flow rate of 100 sccm and $PH_3$ diluted with a hydrogen gas to 1000 ppm was supplied at a flow rate of 2000 sccm. Then, after the pressure was set at 1 Torr, a power of 3 kW was applied so as to generate a plasma and, thus, to form the n-type microcrystalline a-Si:H film.

In these steps, the deposition times were controlled to allow the p-type a-SiC:H layer to have a thickness of 150 Å, to allow the i-type a-Si:H layer to have a thickness of 3200 Å and to allow the n-type microcrystalline a-Si:H layer to have a thickness of 300 Å.

Then, the substrate 1 was taken out of the plasma CVD apparatus, and the a-Si layer 4 consisting of the three layers noted above was patterned by a laser scriber at room temperature (25° C.). In this step, the scribe lines 5 of the a-Si layer 4 were deviated from the scribing lines 3 of the tin oxide layer 2 by 100 nm. To be more specific, the substrate 1 was set on an X-Y table and irradiated with a second harmonic having a wavelength of 532 nm by using a Q-switched YAG laser under the conditions of 3 kHz in the frequency, 500 mW in the average output power and 10 nsec in the pulse width. Incidentally, the separation width was set at 100 μm by shifting the focus point of the laser beam. The substrate was washed again for removing the molten residue generated by laser-scribing.

Further, the substrate 1 was put in a sputtering apparatus, and a ZnO layer (not shown) was formed in a thickness of 1000 Å on the patterned a-Si layer 4 by means of RF magnetron sputtering using a ZnO target. The sputtering was performed under an argon gas pressure of 2 mTorr and a discharge power of 200 W at a temperature of 200° C. In the next step, an Ag layer 6 was formed in a thickness of 2000 Å on the ZnO layer by DC magnetron sputtering using an Ag target. The sputtering was performed under an argon gas pressure of 2 mTorr and a discharge power of 200 W at room temperature.

After formation of the Ag layer 6, the substrate 1 was taken out of the magnetron sputtering apparatus, and the laminate structure consisting of the Ag layer 6, the ZnO layer and the underlying a-Si layer 4 was patterned by using a laser scriber at room temperature (25° C.). In this step, the scribing lines 7 of the Ag layer 6 were deviated from the scribing lines 5 of the a-Si layer 4 by 100 μm. The conditions for this scribing process were equal to those for the a-Si layer 4. The separation width was set at 70 μm, and the string width was set at about 10 mm.

Incidentally, in order to electrically isolate the active portion of the solar battery from the outside, the transparent electrode layer, the semiconductor layer and the back electrode layer positioned up to 5 mm inside the outer periphery of the substrate 1 were removed by treatment with a laser beam. A reference numeral 13 denotes a laser isolation line formed by this operation. Also, the outer regions of strings 11a, 11b positioned at both sides were removed in a width of 3.5 mm so as to form regions 14 for wiring to take out the electrodes using a solder plated copper foil. Then, ultrasonic cleaning was performed within pure water for 2 minutes for removing the residues of the semiconductor layer and the back electrode patterned by the laser scriber. As a result, residues were found to have been removed in all the processed portions.

In the next step, a solder was applied to the regions 14, followed by forming bus bar electrodes 16 consisting of a solder plated copper foil on the solder. The bus bar electrodes 16 were arranged in parallel to the strings in the active region of the solar battery.

Then, the substrate was put in a clean oven so as to be subjected to a heat treatment at 160° C. for 20 minutes in accordance with the method of the present invention.

After the heat treatment, a reverse bias treatment was applied so as to remove the defects of each unit cell. In order to remove the stains generated in the preceding treatments, the solar battery was washed with pure water. Wires were connected to the bus bar electrodes 16. The EVA sheet 8 and the protective film 9 consisting of a fluorocarbon resin were superposed on the back surface of the solar battery, followed by encapsulating with a vacuum laminator. Then, a silicone resin was filled at a takeout portion of the wires. Finally, terminals and a frame was mounted to the substrate.

The current-voltage characteristics of the resultant solar battery module were measured by using an AM 1.5 solar simulator of 100 mW/cm². It was found that the short-circuit current was 1240 mA, the open-circuit voltage was 44.2V, the fill-factor was 0.70, and the maximum output was 38.4 W.

Comparative Example 1

In this Comparative Example 1, a solar battery module was manufactured as in the Example described above, except that the heat treatment step specified in the present invention was not carried out. The current-voltage characteristics of the solar battery module thus prepared were also measured. It was found that the short-circuit current was 1240 mA, the open-circuit voltage was 44.9V, the fill-factor was 0.67, and the maximum output was 35.6 W. Thus, the maximum output for the Comparative Example 1 was lower by about 2 W than that for the Example.

It should also be noted that, where a heat treatment was applied after the scribing of the second electrode layer as in the Example of the present invention, recovery was recognized in every unit cell by the reverse bias treatment. In contrast, in the Comparative Example 1, leak current was observed in half the unit cells even if a reverse bias treatment was performed. This is considered to support that the presence of unit cells in which leak current is generated causes the open-circuit voltage and the FF value to be lowered.

Comparative Example 2

A solar battery module was manufactured by applying a reverse bias treatment after the laser scribing of the second electrode layer and the semiconductor layer, followed by applying a heat treatment in a clean oven at 160° C. for 20 minutes. The current-voltage characteristics of the resultant solar battery module were measured, with the result that the solar battery module exhibited the short-circuit current of 1240 mA, the open-circuit voltage of 43.2V, the fill factor of 0.676, and the maximum output of 36.2 W. The experimental data clearly support that, where a heat treatment is performed after the reverse bias treatment, it is difficult to achieve recovery of defects.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing an integrated thin film solar battery module comprising a substrate, and a plurality of unit cells connected in series on the substrate, each of said unit cells comprising a first electrode layer, a semiconductor layer and a second electrode layer which are stacked one upon the other on the substrate, said method comprising the steps of:

partly removing the first electrode layer formed on the substrate to divide the first electrode layer corresponding to the plurality of unit cells;

forming a semiconductor layer on the first electrode layer;

partly removing the semiconductor layer for each of a plurality of unit cells to form openings for connection to the first electrode layer;

forming a second electrode layer on the semiconductor layer;

partly removing the second electrode layer and the semiconductor layer in the vicinity of the openings formed in the semiconductor layer so as to divide the second electrode layer and the semiconductor layer corresponding to the plurality of unit cells;

allowing an edge surface of the semiconductor layer to be exposed to the outside by removing residues of the second electrode layer and the semiconductor layer; and applying a heat treatment at 130° C. or higher after division of the second electrode layer and the semiconductor layer, wherein said heat treatment is carried out for a time sufficient to make a fresh surface of the semiconductor layer nonconductive.

2. The method according to claim 1, wherein said heat treatment is carried out at a temperature not lower than 150° C. and lower than the temperature for forming the semiconductor layer.

3. The method according to claim 1, wherein said heat treatment is carried out at 150° C. for at least 20 minutes.

4. The method according to claim 1, wherein said heat treatment is carried out at 160° C. for at least 15 minutes.

5. The method according to claim 1, wherein said heat treatment is carried out on the basis of a straight line joining a point corresponding to the condition of 150° C. and 20 minutes and another point corresponding to the condition of 160° C. and 15 minutes depicted on a coordinate system assigning a reciprocal of the absolute temperature on the abscissa and a logarithm of reciprocal of time on the ordinate, and wherein the heat treating time is determined to be longer than a time positioned on the straight line at a predetermined heat treating temperature.

6. The method according to claim 1, wherein said heat treatment is carried out under an air atmosphere.

7. The method according to claim 1, further comprising the step of laminating a resin sheet on the back surface of said unit cells and thermally curing said resin sheet for encapsulating the unit cells.

8. The method according to claim 1, further comprising the step of laminating a resin sheet on the back surface of said unit cells and thermally curing said resin sheet for encapsulating the unit cells, wherein said heat treatment is carried out in the step of the thermal curing of said resin sheet.

9. The method according to claim 1, further comprising the step of applying a reverse bias voltage to said unit cells so as to remove defects after said heat treatment.

10. The method according to claim 1, wherein a part of said first electrode, a part of said semiconductor layer and a part of said second electrode are removed by means of laser beam irradiation.

11. The method according to claim 10, wherein the laser beam irradiation is performed around room temperature.

12. The method according to claim 1, wherein said semiconductor layer contains silicon as a main component.

13. The method according to claim 1, wherein said first electrode comprises a transparent conductive oxide.

14. The method according to claim 1, wherein said second electrode comprises a metal, a laminate comprising at least two metal layers or a laminate comprising a transparent conductive oxide layer and a metal layer.

* * * * *